US007084708B2

(12) United States Patent
Sugiura et al.

(10) Patent No.: US 7,084,708 B2
(45) Date of Patent: Aug. 1, 2006

(54) HIGH-FREQUENCY AMPLIFICATION DEVICE

(75) Inventors: Masayuki Sugiura, Yokohama (JP); Makoto Shibamiya, Tokyo (JP); Yasuhiko Kuriyama, Yokohama (JP); Toru Sugiyama, Kunitachi (JP); Yoshikazu Tanabe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 184 days.

(21) Appl. No.: 10/888,496

(22) Filed: Jul. 12, 2004

(65) Prior Publication Data

US 2005/0236689 A1    Oct. 27, 2005

(30) Foreign Application Priority Data

Apr. 23, 2004    (JP) .............................. 2004-128154

(51) Int. Cl.
    *H03F 3/04*    (2006.01)
(52) U.S. Cl. .......................... 330/302; 330/278; 330/67
(58) Field of Classification Search ................ 330/302, 330/278, 67; 333/33, 245; 257/499
    See application file for complete search history.

(56) References Cited

U.S. PATENT DOCUMENTS 4,837,536 A * 6/1989 Honjo ....................... 505/210

| 6,400,240 B1 * | 6/2002 | Nishida et al. ............. 333/245 |
| 6,556,416 B1 * | 4/2003 | Kunihiro ...................... 361/277 |
| 6,815,796 B1 * | 11/2004 | Ota et al. .................... 257/528 |

FOREIGN PATENT DOCUMENTS

| JP | 08-32018 | 2/1996 |
| JP | 08-088523 | 4/1996 |
| JP | 2002-171144 | 6/2002 |

* cited by examiner

*Primary Examiner*—Patricia Nguyen
(74) *Attorney, Agent, or Firm*—Banner & Nitcoff Ltd.

(57) ABSTRACT

A high-frequency amplification device includes a high-frequency amplifier including input and output sections, a first capacitor including first and second electrodes, and a first insulation film interposed therebetween. The first electrode is connected to the output section via a first inductor, and the second electrode is grounded. The amplification device further comprises a second capacitor including third and fourth electrodes and a second insulation film interposed therebetween. The third electrode is formed of a material substantially identical to that of the first electrode, and the fourth electrode is formed of a material substantially identical to that of the second electrode. The second insulation film is formed of a material substantially identical to that of the first insulation film and has a thickness substantially identical to that of the first insulation film.

12 Claims, 14 Drawing Sheets

HIGH-FREQUENCY AMPLIFICATION DEVICE

CROSS-REFERENCE TO RELATED APPLICATIONS

This application is based upon and claims the benefit of priority from prior Japanese Patent Application No. 2004-128154, filed Apr. 23, 2004, the entire contents of which are incorporated herein by reference.

BACKGROUND OF THE INVENTION

1. Field of the Invention

The present invention relates to a high-frequency amplifier for amplifying the high-frequency signal used in, for example, a mobile communication terminal, and more particularly to a high-frequency amplification device equipped with an input/output matching circuit.

2. Description of the Related Art

High-frequency amplifiers are used to amplify the high-frequency signal transmitted from, for example, a mobile communication terminal. An input matching circuit and output matching circuit are connected to each high-frequency amplifier for matching the input/output impedance with that of an external circuit.

Size reduction of, for example, mobile communication terminals is now being developed. In accordance with this, there is also a demand for size reduction of high-frequency amplifiers and matching circuits of a large circuit scale for use in mobile communication terminals. To meet the demand, a technique for forming a matching circuit on a semiconductor chip has been proposed (see Jpn. Pat. Appln. KOKAI Publication No. 8-88523). In this technique, an increase in circuit scale due to the existence of chip components is suppressed by forming, in and on a semiconductor chip incorporating a high-frequency amplifier, all matching circuits that were so far provided on a dielectric substrate.

A GaAs substrate, for example, is used as a semiconductor substrate for processing a high-frequency signal. In the above prior art, however, the semiconductor chip must have a large area for a transmission line serving as an inductor component, inevitably resulting in an increase in the cost of the semiconductor chip. GaAs substrates are more expensive than Si substrates. Further, when a device having a hetero-junction structure, such as a hetero-junction bipolar transistor (HBT), is formed on a GaAs substrate, the GaAs substrate becomes even more expensive since the substrate must be subjected to an epitaxial growth process. Therefore, a transmission line that requires a large area on a semiconductor chip is an unignorable cost-increasing factor.

Further, the wiring resistance of a transmission line on a semiconductor chip is higher than that of a transmission line formed on a dielectric substrate. This is partially because the width of the transmission line is reduced to the order of several tens of µm to prevent an increase in chip area. Furthermore, since the transmission line is formed by a semiconductor process, its thickness is also about several µm, which is another factor of increasing the wiring resistance.

On the other hand, when a transmission line is formed on a dielectric substrate, it has a width of 100 µm or more and a thickness of at least several tens of µm. Thus, the wiring resistance is much lower than in the case of a transmission line formed on a semiconductor chip. A high wiring resistance causes a power loss in a matching circuit, which degrades the efficiency of high-frequency amplifiers.

BRIEF SUMMARY OF THE INVENTION

According to an aspect of the invention, there is provided a high-frequency amplification device comprising: a high-frequency amplifier including an input section and an output section; a first capacitor including a first electrode, a second electrode, and a first insulation film interposed between the first electrode and the second electrode, the first electrode being connected to the output section via a first inductor, the second electrode being grounded; and a second capacitor including a third electrode, a fourth electrode, and a second insulation film interposed between the third electrode and the fourth electrode, the third electrode being formed of a material substantially identical to a material of the first electrode, the fourth electrode being formed of a material substantially identical to a material of the second electrode, the second insulation film being formed of a material substantially identical to a material of the first insulation film, the second insulation film being of a thickness substantially identical to a thickness of the first insulation film.

DETAILED DESCRIPTION OF THE INVENTION

The inventors of the present invention developed a high-frequency amplification device described below before the development of the present invention.

Figure 16:
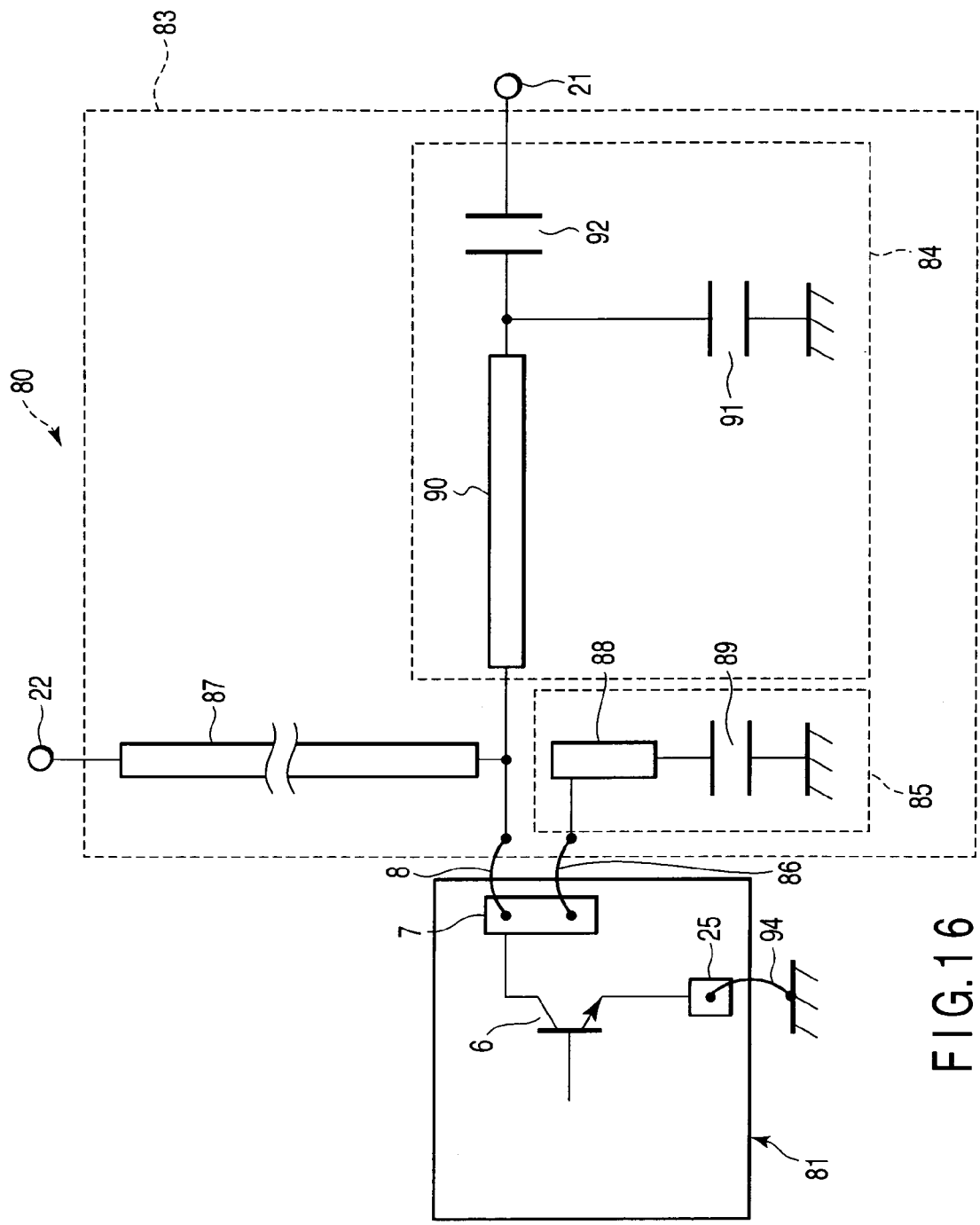
FIG. 16 is a circuit diagram illustrating a high-frequency amplification device 80 according to an embodiment.
Figure 17:
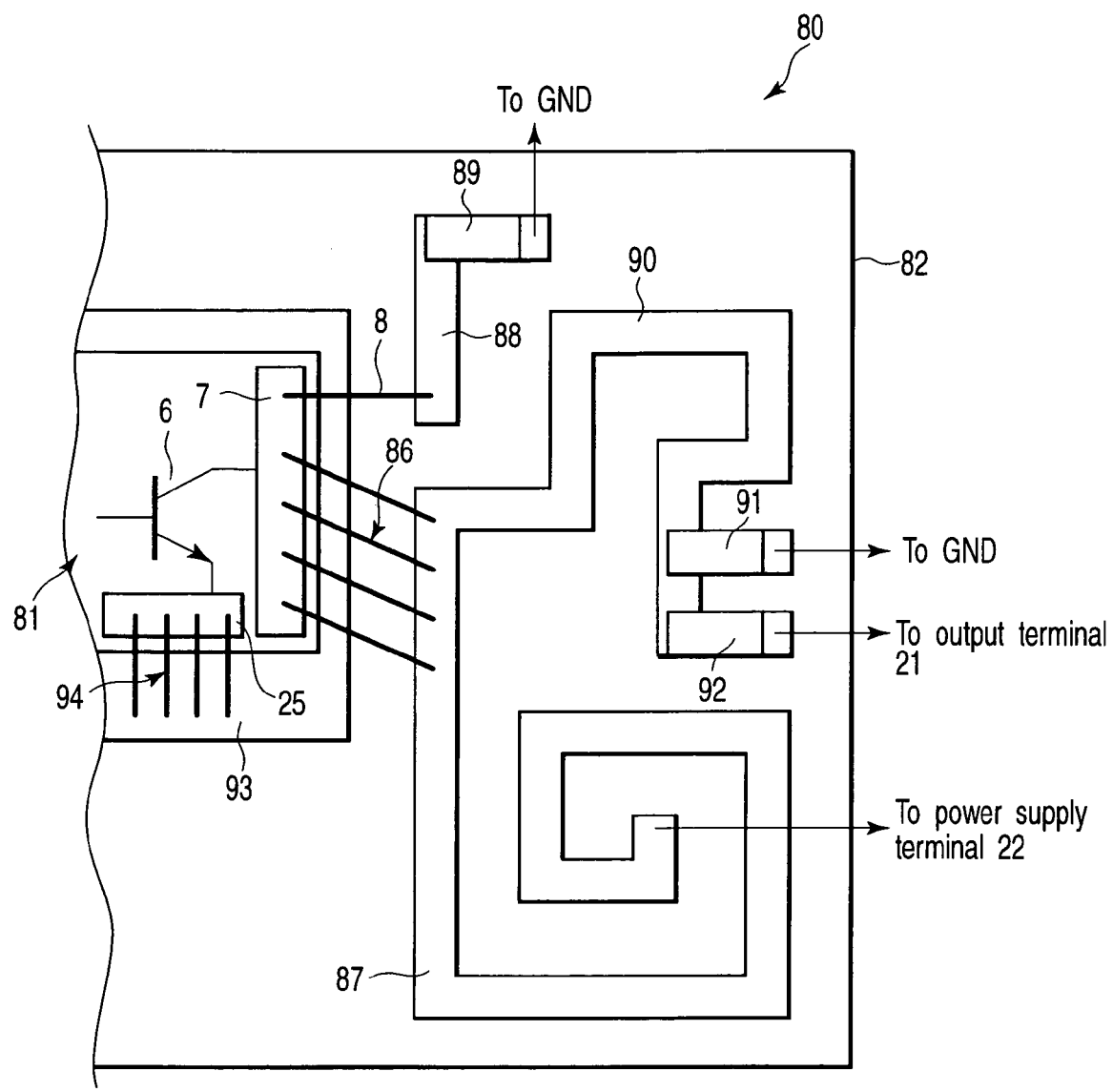
FIG. 17 is a plan view illustrating the high-frequency amplification device 80 of FIG. 16.

FIG. 16 is a circuit diagram illustrating a high-frequency amplification device 80 according to an embodiment. FIG. 17 is a plan view of the high-frequency amplification device 80 of FIG. 16. In the high-frequency amplification device 80, the output impedance is adjusted to, for example, 50Ω so that no external components are needed except for a voltage-smoothing bypass capacitor connected to a power supply circuit.

The high-frequency amplification device 80 comprises a ceramic substrate with an output matching circuit 83 formed thereon, and a semiconductor chip 81 mounted on the substrate 82 by, for example, silver paste. The output matching circuit 83 includes inductors 88 and 90 formed of strip lines, capacitors 89, 91 and 92 formed of chip components, and a current supply line 87 (formed of a spiral inductor).

A hetero-junction bipolar transistor (hereinafter referred to as an "HBT") 6 serving as an amplifier is provided on the semiconductor chip 81. The HBT 6 and output matching circuit 83 are connected to each other via Au wires 8, 86 and 94 and a pad 7. The emitter of the HBT 6 is connected to a ground (GND) component 93 via an Au wire 94 and pad 25. An output signal is output from an output terminal 21.

In this embodiment, three chip capacitors for the output matching circuit 83 are mounted on the ceramic substrate 82 by solder. The output matching circuit 83 includes a fundamental-frequency matching circuit 84 and harmonic matching circuit 85.

From the high-frequency amplification device 80, the following could be found:

The output impedance of the HBT 6 to a fundamental-frequency signal is determined by the inductance of the inductor 90 and the capacitances of capacitors 91 and 92. When the capacitors 91 and 92 are formed of chip components, variations occur in capacitance because of displacements of the chip components when they are mounted, or the tolerances of the chip components, resulting in a reduction in yield. This may increase the cost.

To minimize the variations in capacitance, strict management of the components to reduce the tolerances is possible. This inevitably increases the cost, therefore is not a fundamental improvement. Further, in this case, the cost of the chip components and the cost of mounting them are increased, and still, the yield when the components are mounted is not 100%, which entails further cost.

Recently, chip components themselves have been reduced in size, and the bottom surface area and height of each component have been reduced to 0.6 mm×0.3 mm and 0.3 mm, respectively. However, to mount a component, a mounting area at least as large as the area of the component is required. Furthermore, to prevent short-circuiting between adjacent components or between a component and wire due to, for example, a solder bridge, a zone with no wires or components is needed around each component. Thus, the area required for mounting chip components is unignorable, which limits the downsizing of the high-frequency amplification device 80 that requires chip components.

The present invention has been developed in light of the above findings. A description will now be given of the present invention with reference to the accompanying drawings. In the embodiments described below, like reference numerals denote like elements, and duplicate description is given only when needed.

First Embodiment

Figure 1:
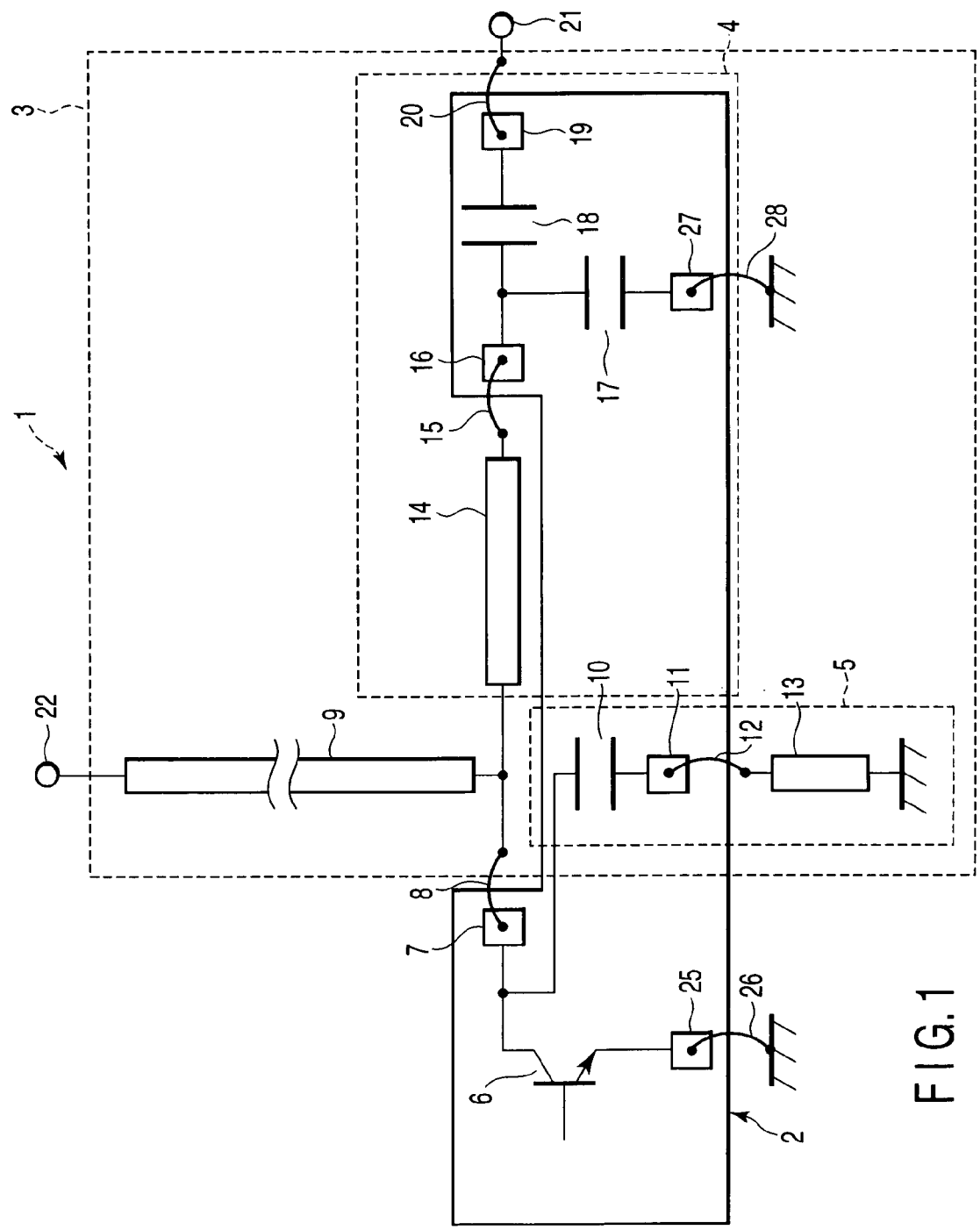
FIG. 1 is a circuit diagram illustrating a high-frequency amplification device 1 according to a first embodiment of the invention.
Figure 2:
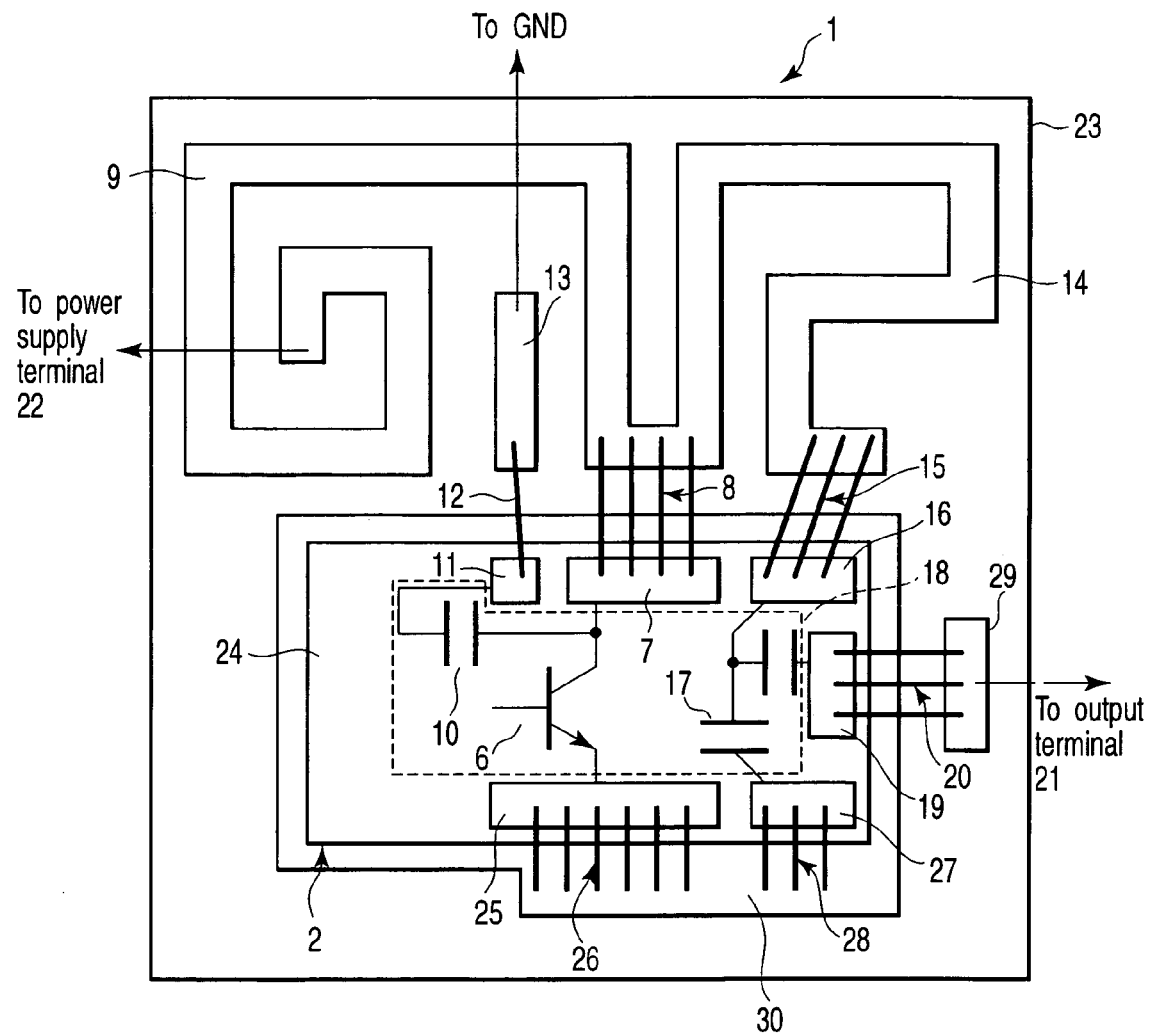
FIG. 2 is a plan view illustrating the high-frequency amplification device 1 of FIG. 1.

FIG. 1 is a circuit diagram illustrating a high-frequency amplification device 1 according to a first embodiment of the invention. FIG. 2 is a plan view illustrating the high-frequency amplification device 1 of FIG. 1.

As shown, the emitter of the HBT 6 is connected to a ground (GND) layer 30 via a pad 25. The base of the HBT 6 receives an input signal. An input circuit or input matching circuit (not shown) is connected to the base of the HBT 6. A pad 7 is connected to the collector of the HBT 6. An output matching circuit 3 is also connected to the collector of the HBT 6. The output matching circuit 3 performs impedance matching with an external circuit (not shown) connected to the output side of the high-frequency amplification device 1. The output matching circuit 3 comprises a current supply line 9, fundamental-frequency matching circuit 4 and harmonic matching circuit 5.

The current supply line 9 is formed of an inductor. One terminal of the current supply line 9 is connected to a power supply terminal 22. The power supply terminal 22 receives a power supply voltage, and applies the voltage to the HBT 6. The other terminal of the current supply line 9 is connected to the pad 7 via a wire 8.

The harmonic matching circuit 5 comprises a metal-insulator-metal (MIM) capacitor 10 and inductor 13. One electrode of the MIM capacitor 10 is connected to the collector of the HBT 6, and the other electrode is connected to a pad 11. One terminal of the inductor 13 is connected to the pad 11 via a wire 12, and the other terminal is connected to the GND 30.

The fundamental-frequency matching circuit 4 comprises an inductor 14 and MIM capacitors 17 and 18. One terminal of the inductor 14 is connected to the pad 7 via the wire 8, and the other terminal is connected to a pad 16 via a wire 15. The inductor 14 is in a spiral shape. However, the shape of the inductor 14 is not limited to this, but may be, for example, a meandering shape. One electrode of the MIM capacitor 17 is connected to a pad 16, and the other electrode is connected to the GND 30 via a pad 27. One electrode of the MIM capacitor 18 is connected to the pad 16, and the other electrode is connected to a pad 19. The pad 19 is connected to the output terminal 21 via a wire 20.

The current supply line 9 is used to supply a direct current to the collector of the HBT 6. The current supply line 9 exhibits high impedance to a high-frequency signal and low impedance to a direct current. As a result, the line 9 can interrupt high-frequency signals and supply the collector of the HBT 6 with the power supply direct current supplied from the power supply terminal 22.

The harmonic matching circuit 5 is used as a second harmonic matching circuit for adjusting, to substantially 0 Ω, the impedance of a component having a frequency twice the fundamental frequency of a to-be-amplified radio frequency (RF) signal. Specifically, it adjusts, to substantially 0 Ω, the impedance of the second harmonic component, using the series resonance of the capacitance of the MIM capacitor 10 and the inductance of the inductor 13 and wire 12.

The fundamental-frequency matching circuit 4 is used as an impedance matching circuit for fundamental-frequency signals. In the embodiment, the fundamental-frequency matching circuit 4 is provided as a lowpass filter type matching circuit formed of the inductor 14 and MIM capacitor 17. The MIM capacitor 18 also functions to prevent a direct current (DC) from leaking to the output terminal 21.

The high-frequency amplification device 1 having the above-described circuitry will be described in more detail.

The high-frequency amplification device 1 comprises a dielectric substrate 23 and semiconductor chip 2. The dielectric substrate 23 has a multilayer structure including wiring layers and dielectric layers of a resin, such as glass epoxy. For example, the substrate 23 is formed of three dielectric layers and four wiring layers. The high-frequency amplification device 1 of the embodiment is designed as a power amplifying circuit for outputting a code division multiple access (CDMA) signal of, for example, a 900 MHz band. The dielectric substrate 23 has a bottom surface with each side of 4 mm.

The lowermost layer of the dielectric substrate 23 has a ground pattern and land pattern for the mounting of the high-frequency amplification device 1 onto a substrate. The semiconductor chip 2 is mounted on the uppermost layer of the dielectric substrate 23. Au wires are used to electrically connect the dielectric substrate 23 to the semiconductor chip 2. In FIG. 2, each terminal (output terminal 21, power supply terminal 22, etc.) is provided below the uppermost layer of the dielectric substrate 23.

In the dielectric substrate 23, wires (not shown) necessary to connect, for example, the input/output terminal of the circuit to the land pattern of the high-frequency amplification device 1, the current supply line 9 and the inductors 13 and 14 are provided as wiring layers. These wiring layers are formed by patterning copper-plating with a thickness of several tens of μm into a wiring width of about 100 μm. For connecting these wiring layers to each other, via holes (not shown) formed by, for example, a laser or drill are used. Further, the dielectric substrate 23 also includes a pad 29 connected to the output terminal 21, and the ground (GND) layer 30.

The semiconductor chip 2 includes the HBT 6, MIM capacitors 10, 17 and 18. A semiconductor substrate 24 incorporated in the semiconductor chip 2 is a GaAs substrate including epitaxial layers, in and on which elements are formed. The HBT 6 is formed in and on the semiconductor substrate 24, and the MIM capacitors 10, 17 and 18 are formed thereon. Further, the pads 7, 11, 16, 19, 25 and 27 for connection to external circuits are provided on the semiconductor substrate 24. In FIG. 2, the zone enclosed by the broken line is a circuit diagram, while the other zone is a pattern view. The layout of the elements in the enclosed zone is determined so that the wires that connect the elements will have short lengths. The wires provided on the semiconductor substrate 24 are formed by patterning Au-plating with a thickness of 5 μm into a wiring width of about 10 μm.

The pad 19 on the semiconductor substrate 24 is connected to the pad 29 on the dielectric substrate 23 by the wire 20. The pad 25 is connected to the emitter of the HBT 6. Further, the pad 25 and GND 30 are connected by a wire 26. The pad 27 is connected to the MIM capacitor 17. The pad 27 and GND 30 are connected by a wire 28.

The MIM capacitors 10, 17 and 18 incorporated in the output matching circuit 3 are simultaneously formed in a semiconductor-chip manufacturing process. Referring now to FIGS. 3 to 7, the manufacturing process of the MIM capacitors 17 and 18 will be described.

Figure 3:
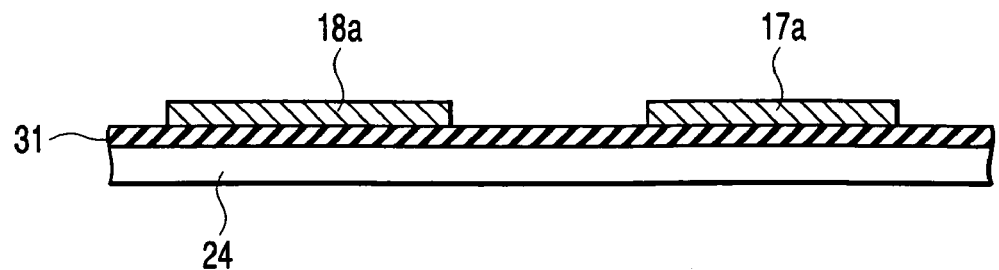
FIG. 3 is a sectional view useful in explaining a process step for manufacturing MIM capacitors 17 and 18.
Figure 4:
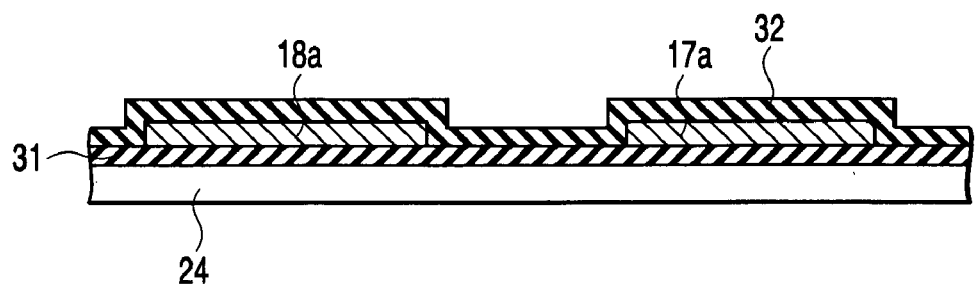
FIG. 4 is a sectional view useful in explaining a step subsequent to the step of FIG. 3.
Figure 5:
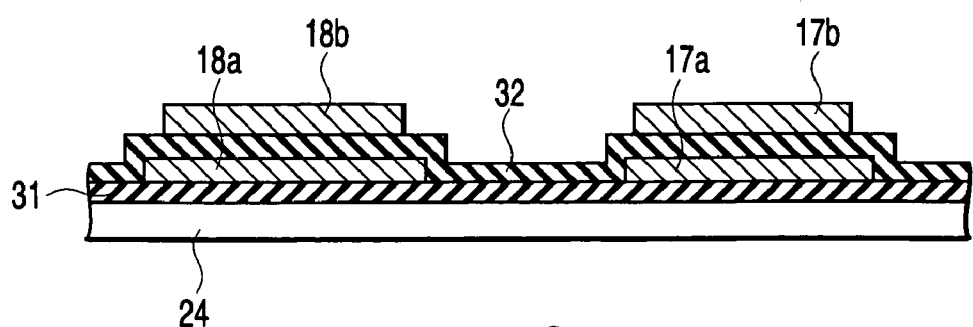
FIG. 5 is a sectional view useful in explaining a step subsequent to the step of FIG. 4.
Figure 6:
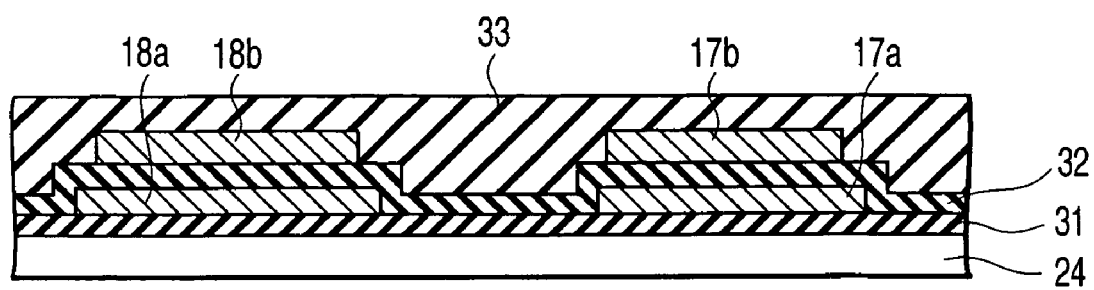
FIG. 6 is a sectional view useful in explaining a step subsequent to the step of FIG. 5.

In FIG. 3, an insulation layer 31 is formed on the semiconductor substrate 24. The insulation layer 31 is formed of, for example, $SiO_2$. The lower electrodes 17a and 18a of the MIM capacitors 17 and 18 are formed on predetermined portions of the insulation layer 31. More specifically, a laminated metal layer of a predetermined thickness (e.g., a metal-layer including a Ti layer with a thickness of about 20 nm, Pt layer with a thickness of about 30 nm and Au layer with a thickness of about 250 nm, which is laminated in this order) is formed and patterned by, for example, a liftoff method using photolithography. The areas of the lower electrodes 17a and 18a are determined from the capacitances of the capacitors 17 and 18.

An insulation film 32 of a predetermined thickness is formed on the lower electrodes 17a and 18a. The insulation film 32 is formed of, for example, SiN. Further, the insulation film 32 is formed by, for example, plasma assisted chemical vapor deposition (CVD). The material of the insulation film 32 is not limited to SiN, but may be, for instance, $SiO_2$. Upper electrodes 17b and 18b are provided on the portions of the insulation film 32 that correspond to the lower electrodes 17a and 18a, respectively. Like the lower electrodes 17a and 18a, the upper electrodes 17b and 18b are patterned, by photolithography, into predetermined areas that are determined from the capacitances of the MIM capacitors 17 and 18.

Figure 7:
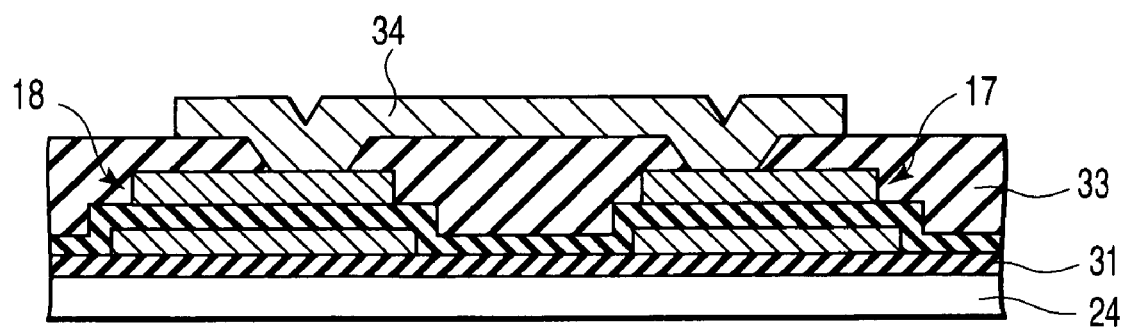
FIG. 7 is a sectional view useful in explaining a step subsequent to the step of FIG. 6.

Subsequently, an insulation film 33 is formed on the resultant structure. The insulation film 33 is formed of, for example, polyimide. The material of the insulation film 33 is not limited to polyimide, but may be, for instance, $SiO_2$. A wire 34 is formed on the insulation film 33 and connected to the upper electrodes 17b and 18b. As a result, the MIM capacitors 17 and 18 as shown in FIG. 7 are formed. The other MIM capacitors provided on the semiconductor substrate 24 are formed in the same process.

Since the MIM capacitors 17 and 18 are formed in the same process, any variations in the factors determining their capacitances occur with certain consistency. This will be explained. The MIM capacitors 17 and 18 are designed to have different capacitances, therefore their designed electrode areas differ from each other. Assume here that after the capacitors are formed in the same process, they have capacitances different from the designed ones. In this case, however, variations in the factors that cause such errors exhibit certain consistency based on manufacturing precisions. The factors are actually the electrode area and insulation film thickness. Variations in electrode area occur due to variations in the exposure condition and/or development condition in photolithography. Further, variations in insulation film thickness occur due to the conditions of deposition (temperature, deposition method, etc.). Since the MIM capacitors 17 and 18 are formed under the same conditions, the electrode areas and/or insulation film thicknesses of both capacitors will be increased or decreased to the same degree.

Figure 8:
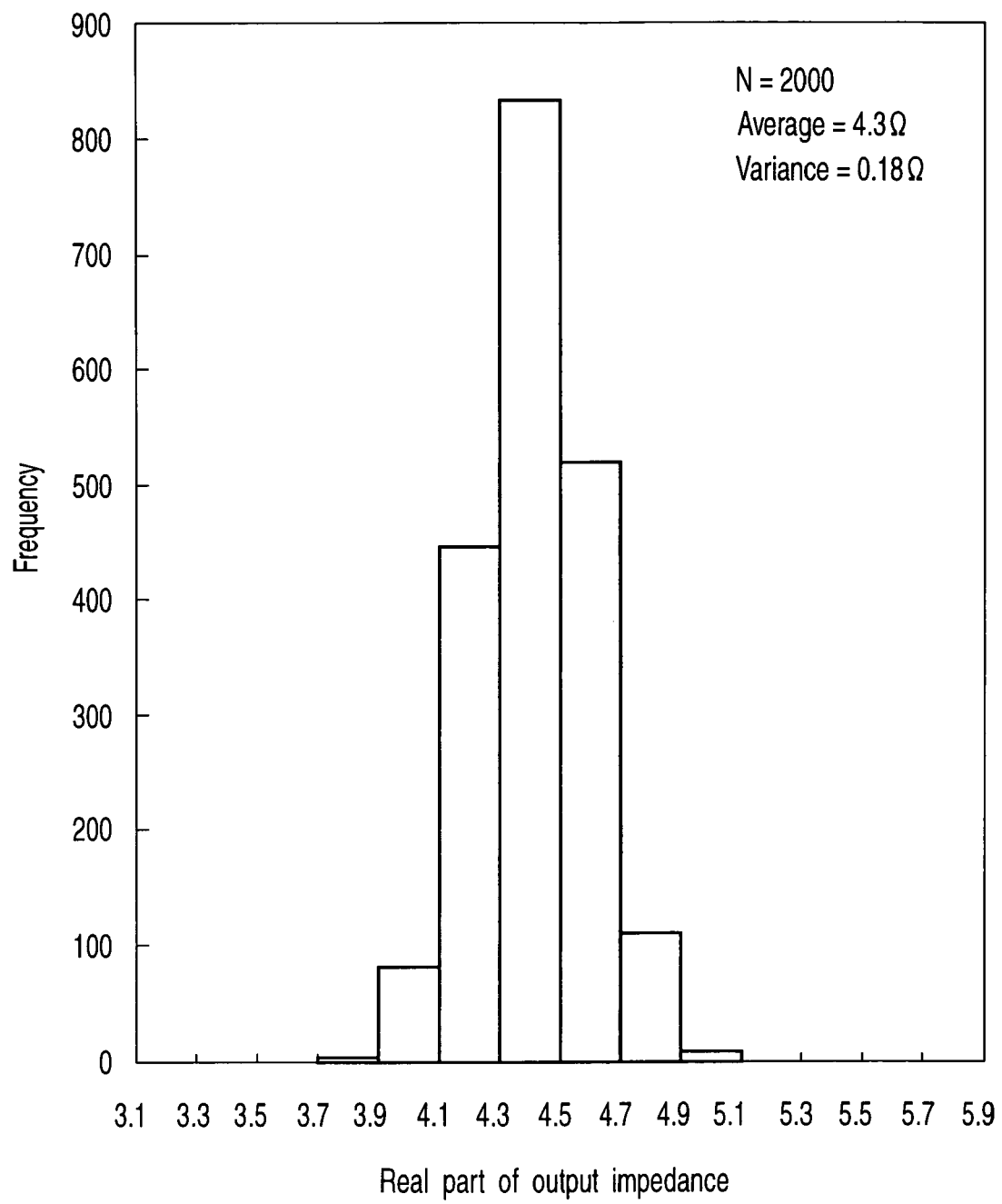
FIG. 8 is a graph illustrating simulation results concerning variations in the output impedance of the high-frequency amplifier 1 of FIG. 1.
Figure 9:
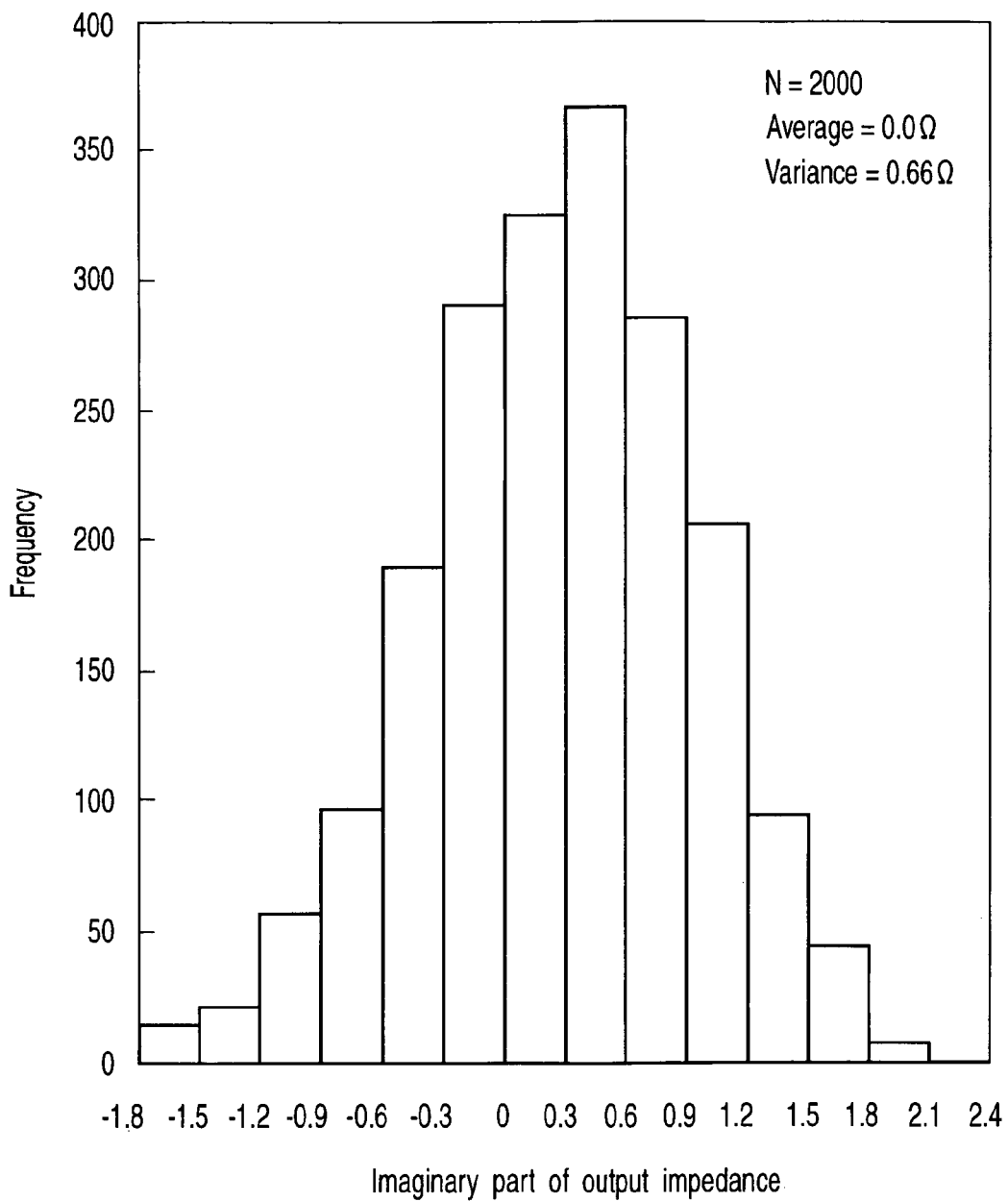
FIG. 9 is a graph illustrating simulation results concerning variations in the output impedance of the high-frequency amplifier 1 of FIG. 1.
Figure 10:
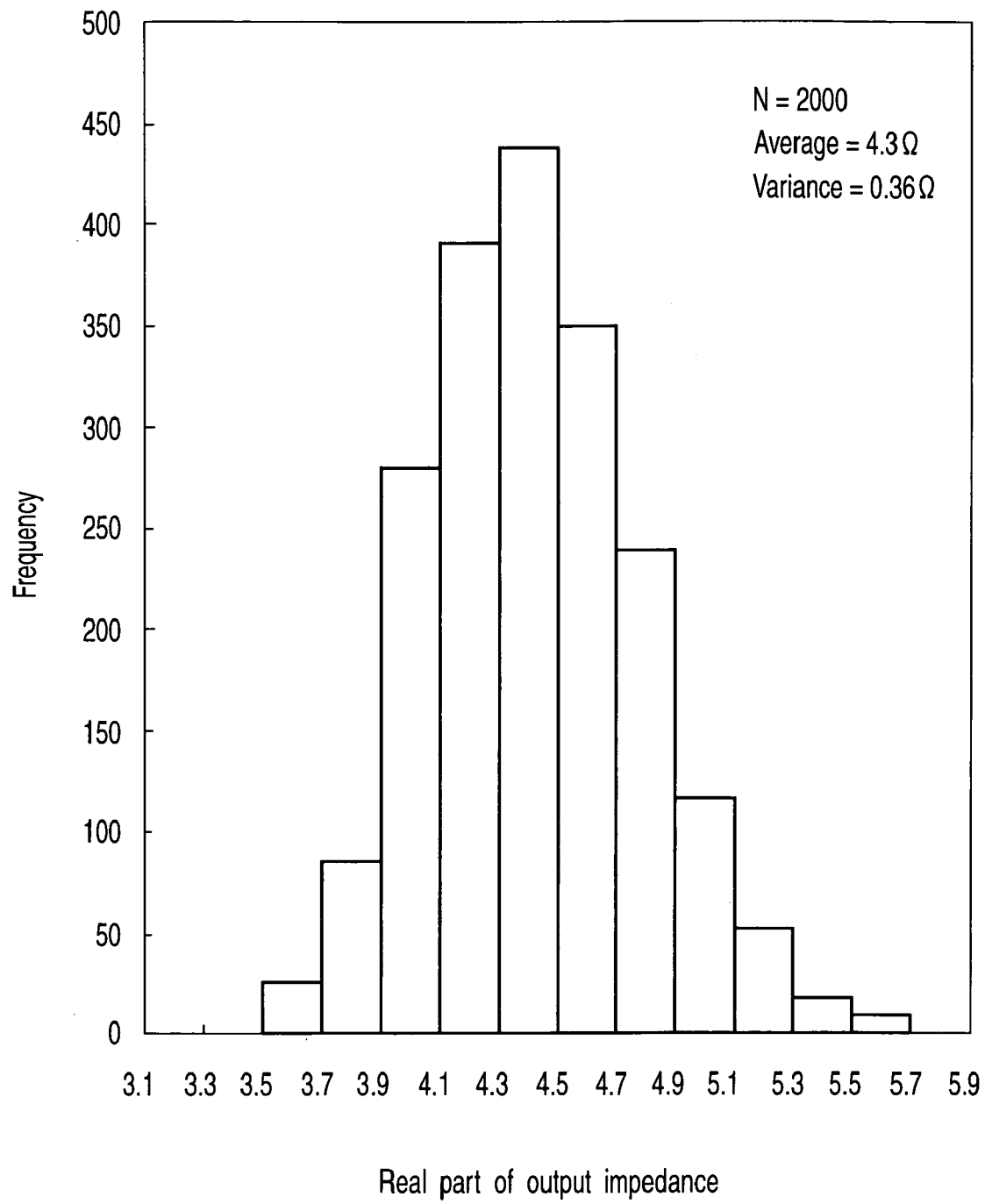
FIG. 10 is a graph illustrating simulation results concerning variations in the output impedance of the high-frequency amplifier 1 when the amplifier 1 is formed of a chip component.
Figure 11:
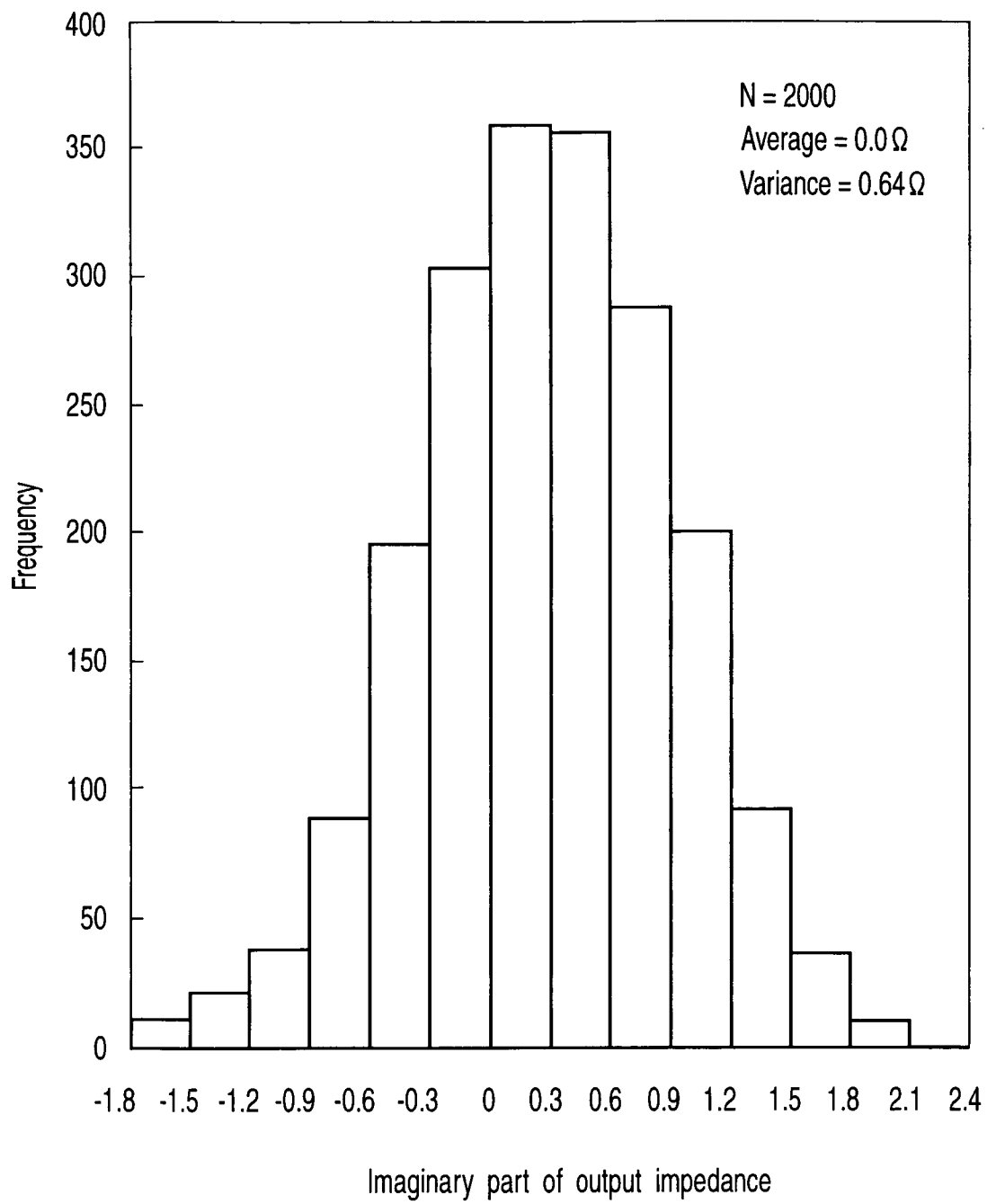
FIG. 11 is a graph illustrating simulation results concerning variations in the output impedance of the high-frequency amplifier 1 when the amplifier 1 is formed of a chip component.

In the first embodiment, the output matching circuit 3 is designed so that the output impedance of the HBT 6 to a signal of 900 MHz is 4.3 Ω. In this case, the capacitances of MIM capacitors 17 and 18 are 5 pF and 8 pF, respectively. FIGS. 8 and 9 show variations in output impedance simulated on the assumption that a variance of 5% has occurred in the capacitances of the MIM capacitors 17 and 18. Further, FIGS. 10 and 11 show variations in output impedance simulated on the assumption that a matching circuit corresponding to the output matching circuit 3 is formed of a chip component, and a variance of 5% occurs in the capacitances of the chip component.

The number (N) of samples used is 2000. In FIGS. 8 and 10, the abscissa indicates the real part of the output impedance, and the ordinate indicates the frequency. In FIGS. 9 and 11, the abscissa indicates the imaginary part of the output impedance, and the ordinate indicates the frequency. In the case of the MIM capacitors, the average and variance of the real part of the output impedance were 4.3Ω and 0.18Ω, respectively. Further, the average and variance of the imaginary part of the output impedance were 0.0Ω and 0.66Ω, respectively. On the other hand, in the case of the chip component, the average and variance of the real part of the output impedance were 4.3Ω and 0.36Ω, respectively. Further, the average and variance of the imaginary part of the output impedance were 0.0Ω and 0.64Ω, respectively.

As is evident from the comparison results, the variance of the imaginary part of the output impedance is substantially the same between the MIM capacitors and chip component. However, the variance of the real part of the output impedance in the case where MIM capacitors are incorporated in the semiconductor chip 2 (FIG. 8) is only half that in the case shown in FIG. 10. This is because the capacitances of the MIM capacitors 17 and 18 are increased or decreased to the same degree.

The output characteristic of the high-frequency amplification device 1 significantly depends upon the real part of the output impedance. If the range of variations in the real part of the output impedance is reduced by half, the range of variations in the output characteristic can be reduced by half. As a result, a reduction in the yield of high-frequency amplification devices due to variations in the output characteristic can be suppressed, which contributes to a reduction in the cost of manufacturing high-frequency amplification devices 1.

Further, since MIM capacitors are formed by a highly accurate semiconductor process, their capacitance can be actually controlled to a variance of 5% or less. On the other hand, in the case of using a chip component, variation due to displacement of the chip component when it is mounted may well occur. Therefore, actually, an increase in yield more than an improvement in the distributions shown in FIGS. 8 and 10 can be expected.

Moreover, in the first embodiment, the output matching circuit 3 requires no chip component, therefore only the chip component 2 is mounted on the dielectric substrate 23. Accordingly, the cost of another chip component and the cost of mounting this chip component can be eliminated. Further, the reduction of the number of chip components mounted increases the yield of mounting, thereby further reducing the entire manufacturing cost.

In addition, the formation of inductors using copper wires on the dielectric substrate 23 enables the output matching circuit 3 to be realized with its wiring resistance kept low. As a result, the high-frequency amplification device 1 is free from a reduction in efficiency due to an increase in the power loss of the output matching circuit 3.

As described above in detail, in the first embodiment, a reduction in the cast for manufacturing the high-frequency amplification device 1, an increase in the efficiency of the device 1, and a reduction in the size of the device 1 can be realized.

Figure 12:
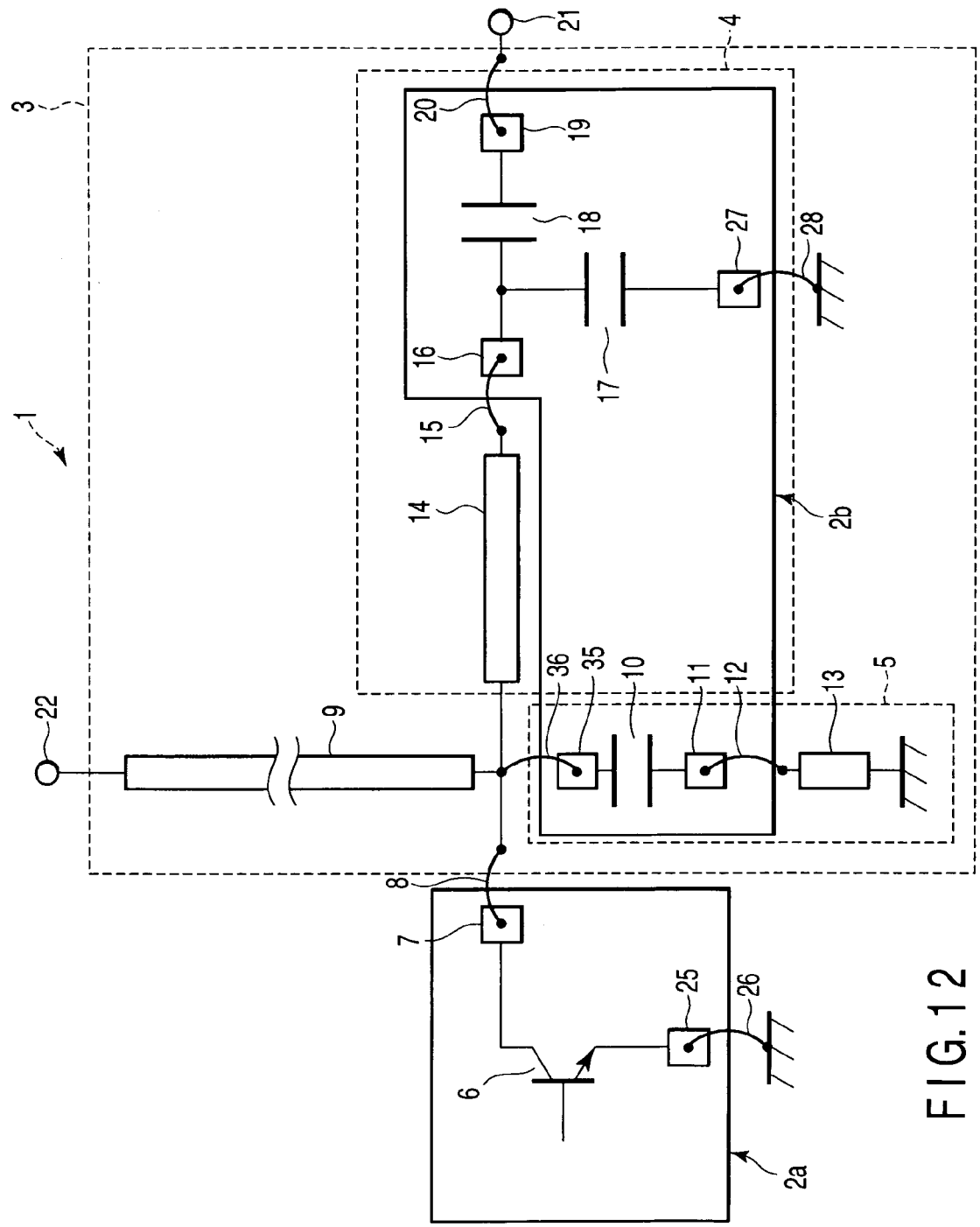
FIG. 12 is a circuit diagram illustrating a high-frequency amplification device that incorporates two different chips, i.e., a semiconductor chip 2a on which an HBT 6 is formed, and a semiconductor chip 2b on which an MIM capacitor is formed.

The HBT 6 and MIM capacitors can be incorporated in different semiconductor chips. FIG. 12 is a circuit diagram illustrating a high-frequency amplification device 1, in which the HBT 6 is formed in and on a semiconductor chip 2a, and MIM capacitors are formed on a semiconductor chip 2b. The collector of the HBT 6 is connected to the MIM capacitor 10 by a pad 35 and wire 36. The other structure is similar to that employed in the high-frequency amplification device 1 of FIG. 1.

The structure of FIG. 12 can also provide the above-mentioned advantage. Further, since two chip components are used, it is not necessary to use an expensive GaAs substrate formed of epitaxial element-forming layers as the semiconductor chip 2b provided with MIM capacitors. In this case, it is sufficient if a cheap semi-insulated GaAs substrate having no element-forming layers is used. As a result, the manufacturing cost can be further reduced. Furthermore, the substrate, on which MIM capacitors are provided, may be formed of, for example, a dielectric substrate cheaper than a GaAs substrate, thereby further reducing the cost.

Second Embodiment

In a second embodiment, a high-frequency amplification device 40 is formed by flip-chip mounting a semiconductor chip with the HBT 6 and MIM capacitors and a dielectric substrate with inductors.

Figure 13:
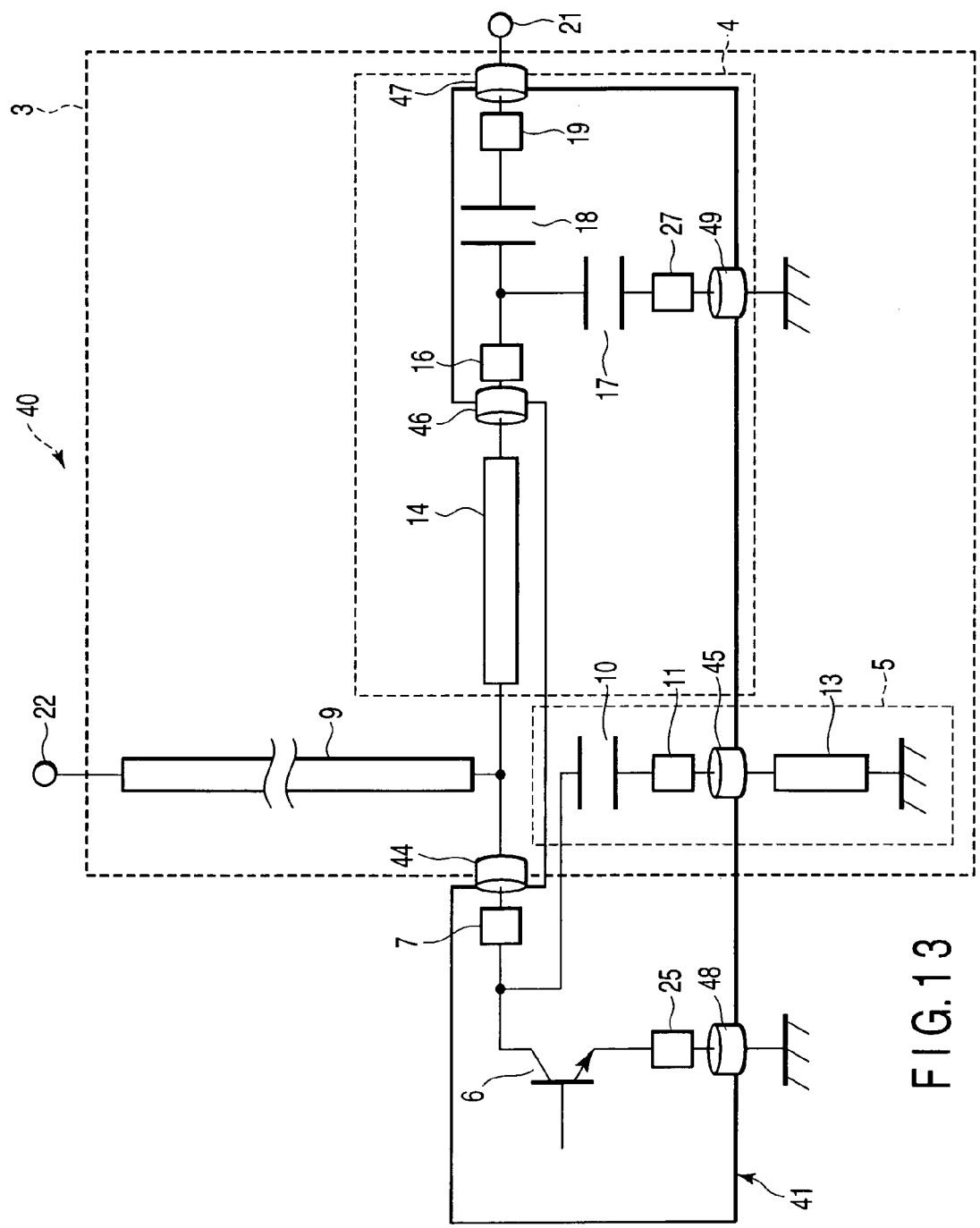
FIG. 13 is a circuit diagram illustrating a high-frequency amplification device 40 according to a second embodiment of the invention.
Figure 14:
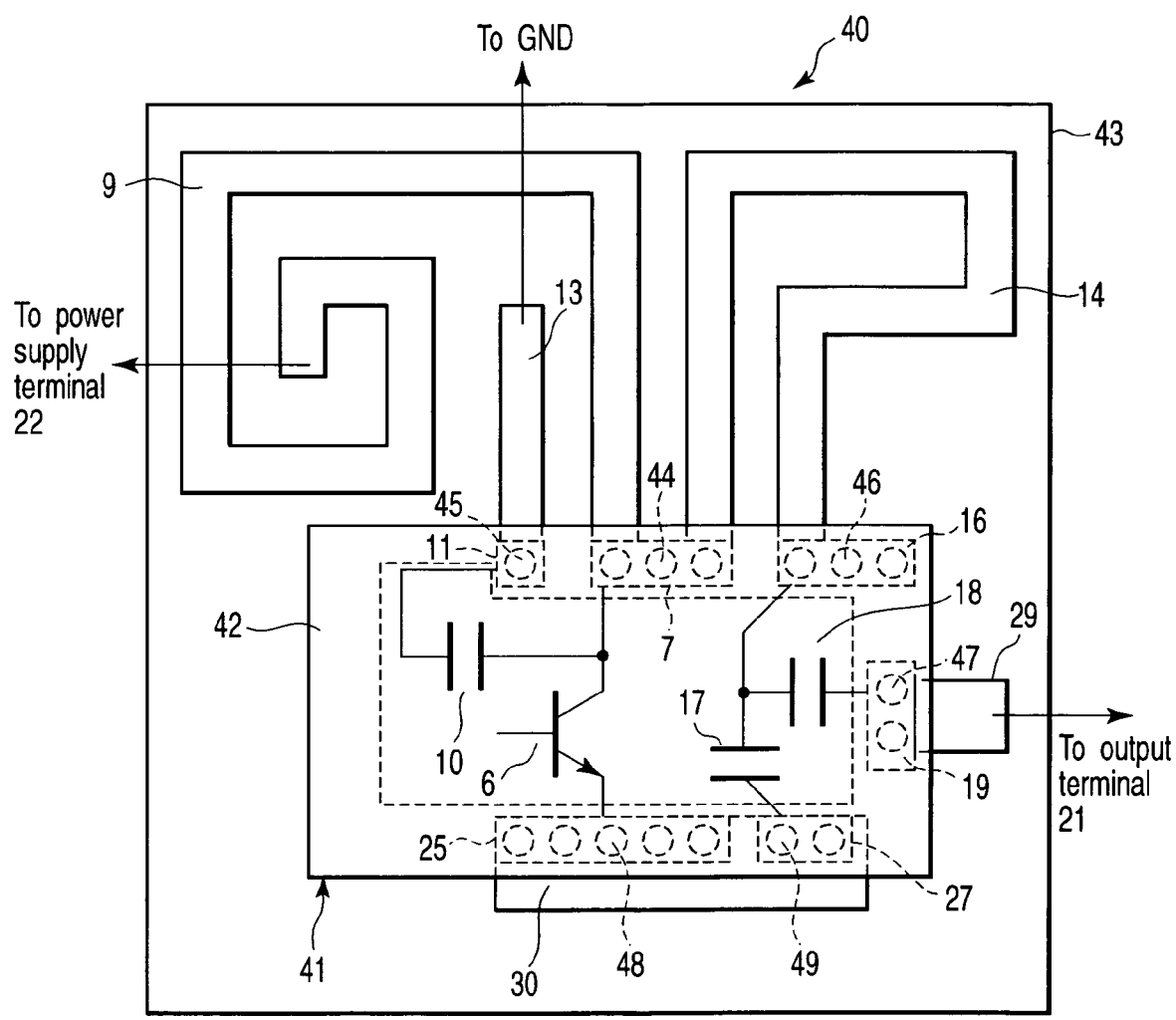
FIG. 14 is a plan view illustrating the high-frequency amplification device 1 of FIG. 13.

FIG. 13 is a circuit diagram illustrating the high-frequency amplification device 40 of the second embodiment. FIG. 14 is a plan view of the high-frequency amplification device 40 of FIG. 13. The second embodiment differs from the first embodiment in that in the former, a semiconductor chip 41 is connected to a dielectric substrate 43 not by a wire, but by a bump.

Bumps 44, 45, 46, 47, 48 and 49 are formed on predetermined portions of the HBT-provided surface of a semiconductor substrate 42 incorporated in the semiconductor chip 41. Each bump is formed of Au and has a diameter of 80 µm and a height of 20 µm. In FIG. 14, the zone enclosed by the broken line is a circuit diagram (showing the HBT 6 formed in and on the semiconductor substrate 42 and the MIM capacitors 10, 17 and 18 formed on the substrate 42), while the other zone is a pattern view.

One terminal of the current supply line 9 and one terminal of the inductor 14 are connected to the pad 7 via the bump 44. One terminal of the inductor 13 is connected to the pad 11 via the bump 45. The other terminal of the inductor 14 is connected to the pad 16 via the bump 46. The pad 19 is connected to the output terminal 21 via the bump 47. The pad 25 and GND 30 are connected by the bump 48. The pad 27 and GND 30 are connected by the bump 49.

The semiconductor chip 41 and dielectric substrate 43 are mounted at predetermined positions by a flip-chip mounting machine.

The high-frequency amplification device 40 of the second embodiment can be made at low cost, can have a high efficiency, and can be made compact as in the first embodiment.

Further, in the first embodiment, the pads provided on the dielectric substrate 23 for bonding wires that connect the dielectric substrate 23 to the semiconductor chip 2 are located in a region outside the region of the semiconductor chip 41. However, in the second embodiment that employs flip-chip mounting, the pads for connecting the dielectric substrate 43 to the semiconductor chip 41 can be located within the region of the semiconductor chip 41. Therefore, the high-frequency amplification device 40 can be made more compact than the high-frequency amplification device 1.

Moreover, the displacement of the semiconductor chip 41 can be limited to several tens of µm or less by flip-chip mounting. This reduces displacement of a semiconductor chip that may occur in the first embodiment, and variations in RF characteristic due to a change in the configuration of wiring. As a result, the yield can be enhanced and the cost can be reduced.

Third Embodiment

A high-frequency amplification device 50 according to a third embodiment comprises two HBTs, input matching circuit and output matching circuit.

Figure 15:
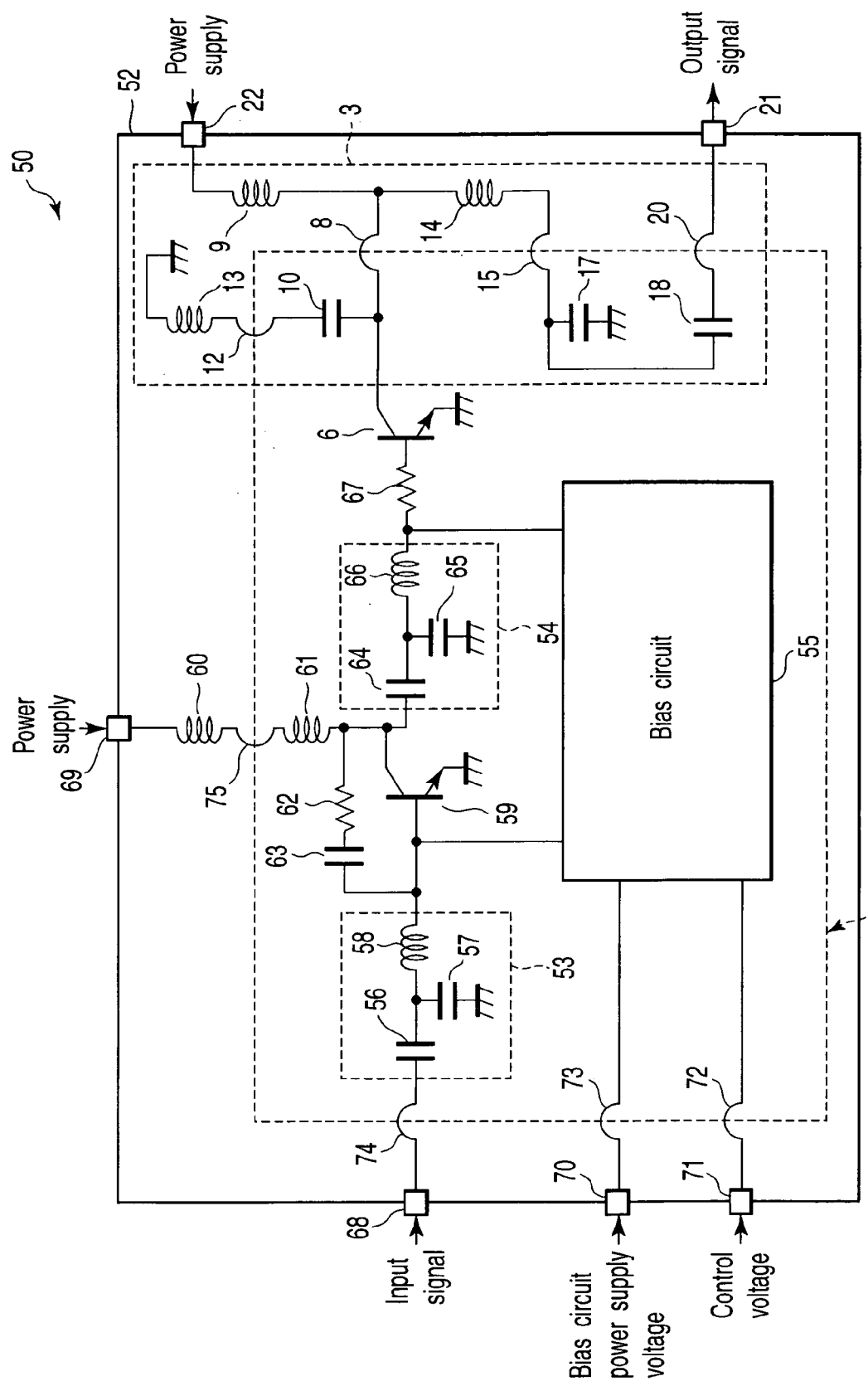
FIG. 15 is a high-frequency amplification device 50 according to a third embodiment of the invention.

FIG. 15 shows the high-frequency amplification device 50 of the third embodiment.

As shown, an input signal to be amplified is input to an input terminal 68. An input matching circuit 53 is connected between the input terminal 68 and the base of an HBT 59 as an amplifier. The input matching circuit 53 adjusts the input impedance to 50Ω. The input matching circuit 53 comprises MIM capacitors 56 and 57 and inductor 58. The capacitor 56 functions as a part of a matching circuit and functions to separate a direct current. The inductor 58 is in a spiral shape. However, the shape of the inductor 14 is not limited to this, but may be, for example, a meandering shape.

The input terminal 68 is connected to one terminal of the MIM capacitor 56. The other terminal of the MIM capacitor 56 is connected to one terminal of the MIM capacitor 57 and one terminal of the inductor 58. The other terminal of the MIM capacitor 57 is connected to the GND. The other terminal of the inductor 58 is connected to the base of the HBT 59.

The collector of the HBT 59 is supplied with a power supply voltage, i.e., a power supply terminal 69 is supplied with the power supply voltage. The power supply terminal 69 is connected to one terminal of an inductor 60. The other terminal of the inductor 60 is connected to one terminal of an inductor 61. The other terminal of the inductor 61 is connected to the collector of the HBT 59. The inductors 60 and 61 provide a current supply line. The current supply line is used to supply a direct current to the collector of the HBT 59. The current supply line exhibits high impedance to a high-frequency signal, and low impedance to a direct current.

An MIM capacitor 73 and resistor 62 are connected in series between the base and collector of the HBT 59. That is, the collector of the HBT 59 is connected to one terminal of the resistor 62, and the other terminal of the resistor 62 is connected to one terminal of the MIM capacitor 63. The other terminal of the MIM capacitor 63 is connected to the base of the HBT 59. The MIM capacitor 63 and resistor 62 provide a negative feedback circuit and serves as an adjustment circuit for adjusting the gain of the high-frequency amplification device 50.

A matching circuit 54 is connected between the collector of the HBT 59 and the base of the HBT 6. The matching circuit 54 comprises MIM capacitors 64 and 65 and inductor 66. The capacitor 65 functions as a part of a matching circuit and functions to separate a direct current. The matching circuit 54 has the same structure as the input matching circuit 53. Further, a resistor 67 is connected between the matching circuit 54 and the base of the HBT 6.

Respective bias currents are supplied from a bias circuit 55 to the bases of the HBTs 6 and 59. The bias circuit 55 includes, for example, emitter followers that supply the bias currents. A stable base current is supplied from a current mirror circuit to the base of the transistor of each emitter follower. The current mirror circuit comprises two diode-connected transistors which are connected in series.

Power supply terminals 70 and 71 are connected to the bias circuit 55. A bias circuit power supply voltage is applied to the power supply terminal 70. A control voltage is applied to the power supply terminal 71. The control voltage is determined from the level of the bias current, or the base-emitter voltage of the transistor included in the bias circuit 55, etc.

The HBT 59 performs first amplification of an input signal, while the HBT 6 performs second amplification of the input signal. Alternatively, input signals may be amplified only by the HBT 6.

The high-frequency amplification device 50 having the above-described circuitry will be described in more detail.

The MIM capacitors 10, 17, 18, 56, 57, 63, 64 and 65 are formed in the same process. This process is similar to that employed in the first embodiment. The inductors 58, 61 and 66 on a semiconductor chip 51 are formed by patterning Au-plating with a thickness of 5 μm. Further, the inductors 9, 13, 14 and 60 on a dielectric substrate 52 are formed by patterning copper plating with a thickness of several tens of μm. The inductors on the semiconductor chip 51 are formed with an insulation layer interposed therebetween. Concerning the inductors 60 and 61 providing the current supply line, the inductor 60 on the dielectric substrate 52 is formed to have a lower inductance than the inductor 61 on the semiconductor chip 51, so that the dielectric substrate 52 can be made to have a smaller area.

The semiconductor chip 51 is mounted on the uppermost layer of the dielectric substrate 52. The semiconductor chip 51 and dielectric substrate 52 are connected by wires 8, 12, 15, 20 and 72 to 75. Each wire is formed of, for example, Au.

As described above in detail, in the third embodiment, the input matching circuit 53 is provided in addition to the output matching circuit 3. Further, input signals are amplified in two stages. Furthermore, MIM capacitors as capacitance components are formed on the same substrate in the same process, and inductor components are formed on the substrate by patterning, without using chip components.

Therefore, in the third embodiment, a reduction in the cost of manufacturing the high-frequency amplification device 50, an increase in the efficiency of the device 50, and a reduction in the size of the device 50 can be realized, as in the first embodiment.

In the high-frequency amplification device 50 of the third embodiment, only the semiconductor chip 51 is mounted and there are no other chip components mounted using, for example, solder, with the result that the cost of another chip component and the cost of mounting it can be eliminated.

Since only the semiconductor chip 51 is mounted, the yield of mounting is enhanced, which contributes to a reduction in cost and in the size of the high-frequency amplification device 50.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A high-frequency amplification device comprising:
    a high-frequency amplifier including an input section and an output section;
    a first capacitor including a first electrode, a second electrode, and a first insulation film interposed between the first electrode and the second electrode, the first electrode being connected to the output section via a first inductor, the second electrode being grounded; and
    a second capacitor including a third electrode, a fourth electrode, and a second insulation film interposed between the third electrode and the fourth electrode, the third electrode being formed of a material substantially identical to a material of the first electrode, the fourth electrode being formed of a material substantially identical to a material of the second electrode, the second insulation film being formed of a material substantially identical to a material of the first insulation film, the second insulation film being of a thickness substantially identical to a thickness of the first insulation film.

2. The high-frequency amplification device according to claim 1, further comprising a semiconductor substrate, and wherein:
the high-frequency amplifier is formed in and on the semiconductor substrate; and
the first capacitor and the second capacitor are formed on the semiconductor substrate.

3. The high-frequency amplification device according to claim 2, further comprising a dielectric substrate, and wherein the first inductor is formed on the dielectric substrate.

4. The high-frequency amplification device according to claim 3, wherein the first inductor is formed of copper plating.

5. The high-frequency amplification device according to claim 3, further comprising a third capacitor which includes a fifth electrode, a sixth electrode, and a third insulation film interposed between the fifth electrode and the sixth electrode, the fifth electrode being formed of a material substantially identical to the material of the first electrode, the sixth electrode being formed of a material substantially identical to the material of the second electrode, the third insulation film being formed of a material substantially identical to the material of the first insulation film, the third insulation film being of a thickness substantially identical to the thickness of the first insulation film, the fifth electrode being connected to the output section, the sixth electrode being grounded via a second inductor.

6. The high-frequency amplification device according to claim 5, wherein:
the third capacitor is formed on the semiconductor substrate; and
the second inductor is formed on the dielectric substrate.

7. The high-frequency amplification device according to claim 3, further comprising:
a fourth capacitor which includes a seventh electrode, an eighth electrode, and a fourth insulation film interposed between the seventh electrode and the eighth electrode, the seventh electrode being formed of a material substantially identical to the material of the first electrode, the eighth electrode being formed of a material substantially identical to the material of the second electrode, the fourth insulation film being formed of a material substantially identical to the material of the first insulation film, the fourth insulation film being of a thickness substantially identical to the thickness of the first insulation film, the seventh electrode being connected to the input section via a third inductor, the eighth electrode being grounded; and
a fifth capacitor which includes a ninth electrode, a tenth electrode, and a fifth insulation film interposed between the ninth electrode and the tenth electrode, the ninth electrode being formed of a material substantially identical to the material of the first electrode, the tenth electrode being formed of a material substantially identical to the material of the second electrode, the fifth insulation film being formed of a material substantially identical to the material of the first insulation film, the fifth insulation film being of a thickness substantially identical to the thickness of the first insulation film, the ninth electrode being connected to the seventh electrode.

8. The high-frequency amplification device according to claim 7, wherein the fourth capacitor and the fifth capacitor are formed on the semiconductor substrate.

9. The high-frequency amplification device according to claim 1, wherein the first capacitor and the second capacitor are formed in a single manufacturing process.

10. The high-frequency amplification device according to claim 3, wherein:
the semiconductor substrate includes a plurality of bumps which electrically connect the semiconductor substrate to the dielectric substrate.

11. The high-frequency amplification device according to claim 1, wherein the first inductor is in a spiral shape or a meandering shape.

12. The high-frequency amplification device according to claim 2, wherein the semiconductor substrate is a GaAs substrate.

* * * * *